US 10,910,253 B2

(12) United States Patent
Inhofer et al.

(10) Patent No.: US 10,910,253 B2
(45) Date of Patent: Feb. 2, 2021

(54) MAGNETICALLY LEVITATED AND ROTATED CHUCK FOR PROCESSING MICROELECTRONIC SUBSTRATES IN A PROCESS CHAMBER

(71) Applicant: TEL FSI, INC., Chaska, MN (US)

(72) Inventors: William P. Inhofer, Plymouth, MN (US); Sean Moore, Maple Grove, MN (US); Lance Van Elsen, Oakdale, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 0 days.

(21) Appl. No.: 15/806,760

(22) Filed: Nov. 8, 2017

(65) Prior Publication Data

US 2018/0130694 A1     May 10, 2018

Related U.S. Application Data

(60) Provisional application No. 62/419,662, filed on Nov. 9, 2016.

(51) Int. Cl.
*H01L 21/687*     (2006.01)
*B08B 5/02*     (2006.01)
(Continued)

(52) U.S. Cl.
CPC .......... *H01L 21/68764* (2013.01); *B08B 3/02* (2013.01); *B08B 3/10* (2013.01);
(Continued)

(58) Field of Classification Search
CPC ......... H01L 21/67748; H01L 21/68792; H01L 21/67051; H01L 21/68764;
(Continued)

(56) References Cited

U.S. PATENT DOCUMENTS

| 3,538,883 A | 11/1970 | Polin |
| 5,554,964 A | 9/1996 | Jansseune |

(Continued)

FOREIGN PATENT DOCUMENTS

| KR | 20110036915 A | 4/2011 |
| WO | 2010054076 A2 | 5/2010 |

OTHER PUBLICATIONS

PCT/US2017/0695166, PCT International Search Report, dated Mar. 29, 2018, 3 pgs.

(Continued)

*Primary Examiner* — Benjamin L Osterhout
(74) *Attorney, Agent, or Firm* — Kagan Binder PLLC

(57) ABSTRACT

Cleaning systems and methods for semiconductor fabrication use rotatable and optionally translatable chuck assemblies that incorporate magnetic levitation and rotation functionality to cause chuck rotation. The rotating chuck components do not physically contact other chuck components when levitated and rotating. This eliminates corresponding components whose friction or lubricants might generate contamination. The low friction chuck functionality of the present invention is useful in any fabrication tool in which a workpiece is supported on a rotating support during a treatment. The chuck is particularly useful in cryogenic cleaning treatments. By avoiding the use of lubricants for this rotating interface, process chambers can be evacuated and/or vented up to higher pressures much faster. This significantly reduces cycle time for cryogenic treatments.

17 Claims, 7 Drawing Sheets

(51) Int. Cl.
   *B08B 3/02* (2006.01)
   *B08B 3/10* (2006.01)
   *H01L 21/67* (2006.01)
   *H02N 15/00* (2006.01)
   *C23C 16/46* (2006.01)
   *H01L 21/677* (2006.01)

(52) U.S. Cl.
   CPC ............... *B08B 5/02* (2013.01); *C23C 16/46* (2013.01); *H01L 21/67051* (2013.01); *H01L 21/67748* (2013.01); *H01L 21/68785* (2013.01); *H01L 21/68792* (2013.01); *H02N 15/00* (2013.01)

(58) Field of Classification Search
   CPC ....... H01L 21/68785; B08B 3/02; B08B 5/02; B08B 3/10; C23C 16/46; H02N 15/00
   See application file for complete search history.

(56) References Cited

U.S. PATENT DOCUMENTS

| | | | |
|---|---|---|---|
| 5,598,974 A | 2/1997 | Lewis et al. | |
| 5,730,803 A | 3/1998 | Steger et al. | |
| 5,961,732 A | 10/1999 | Patrin et al. | |
| 5,965,047 A | 10/1999 | Blersch et al. | |
| 6,146,463 A | 11/2000 | Yudovsky et al. | |
| 6,168,665 B1 | 1/2001 | Sakai et al. | |
| 6,217,423 B1* | 4/2001 | Ohmori | B24B 7/22 451/262 |
| 6,241,577 B1 | 6/2001 | Shibata | |
| 6,290,569 B1 | 9/2001 | Mizuno et al. | |
| 6,435,798 B1 | 8/2002 | Satoh | |
| 8,844,546 B2 | 9/2014 | Chen et al. | |
| 9,564,378 B2 | 2/2017 | Rose et al. | |
| 9,837,260 B2 | 12/2017 | Inai et al. | |
| 10,418,270 B2 | 9/2019 | Hanzlik et al. | |
| 2002/0017237 A1 | 2/2002 | Wirth et al. | |
| 2002/0157686 A1 | 10/2002 | Kenny et al. | |
| 2003/0015141 A1 | 1/2003 | Takagi | |
| 2003/0132746 A1 | 7/2003 | Cox | |
| 2003/0156270 A1* | 8/2003 | Hunter | G03F 7/707 355/72 |
| 2003/0178145 A1 | 9/2003 | Anderson et al. | |
| 2003/0230323 A1 | 12/2003 | You et al. | |
| 2004/0004713 A1 | 1/2004 | Go et al. | |
| 2004/0005212 A1 | 1/2004 | Wu | |
| 2004/0146367 A1 | 8/2004 | Ko et al. | |
| 2004/0163670 A1 | 8/2004 | Ko et al. | |
| 2004/0221877 A1 | 11/2004 | Bergman | |
| 2005/0031497 A1 | 2/2005 | Siebert et al. | |
| 2005/0127927 A1* | 6/2005 | Harris | G01R 1/0408 324/750.2 |
| 2006/0162739 A1 | 7/2006 | Sogard | |
| 2006/0182528 A1 | 8/2006 | Fan et al. | |
| 2007/0209684 A1 | 9/2007 | Chen et al. | |
| 2007/0247778 A1* | 10/2007 | Harb | H01L 21/68 361/234 |
| 2008/0056857 A1 | 3/2008 | Hiroki | |
| 2008/0229811 A1 | 9/2008 | Zhao et al. | |
| 2008/0280453 A1 | 11/2008 | Koelmel et al. | |
| 2009/0114253 A1 | 5/2009 | Matsumoto | |
| 2009/0314211 A1 | 12/2009 | Du Bois et al. | |
| 2010/0012856 A1 | 1/2010 | Aoki | |
| 2011/0188974 A1 | 8/2011 | Diamond | |
| 2012/0325275 A1 | 12/2012 | Goodman et al. | |
| 2013/0062839 A1* | 3/2013 | Tschinderle | H01L 21/67051 279/157 |
| 2013/0152971 A1 | 6/2013 | Kato | |
| 2013/0214497 A1* | 8/2013 | Yoshida | H01L 21/68728 279/131 |
| 2013/0233356 A1* | 9/2013 | Obweger | B08B 3/02 134/33 |
| 2014/0152976 A1 | 6/2014 | VanHoomissen et al. | |
| 2014/0166055 A1 | 6/2014 | Haung et al. | |
| 2014/0332161 A1 | 11/2014 | Ricci et al. | |
| 2015/0187629 A1* | 7/2015 | Obweger | B05B 13/0228 118/730 |
| 2015/0279708 A1 | 10/2015 | Kobayashi et al. | |
| 2016/0096207 A1 | 4/2016 | Butterbaugh et al. | |
| 2016/0172256 A1 | 6/2016 | Rose et al. | |
| 2017/0338131 A1 | 11/2017 | Amahisa et al. | |
| 2018/0151396 A1 | 5/2018 | Hanzlik et al. | |
| 2018/0158717 A1 | 6/2018 | Hanzlik et al. | |
| 2018/0214915 A1 | 8/2018 | Butterbaugh | |
| 2019/0255580 A1 | 8/2019 | Mbanaso | |

OTHER PUBLICATIONS

PCT/US2014/069557, PCT International Search Report, dated Mar. 3, 2015, 5 pgs.
PCT/US2017/063486, PCT International Search Report, dated Mar. 5, 2018, 3 pgs.
PCT/US2018/015545, PCT International Search Report, dated May 14, 2018, 4 pgs.
PCT International Search Report, International Application No. PCT/US2017/060543, dated Feb. 20, 2018, 5 pages.
PCT/US2019/018405 PCT International Search Report, dated May 6, 2019, 2018, 3 pgs.

* cited by examiner

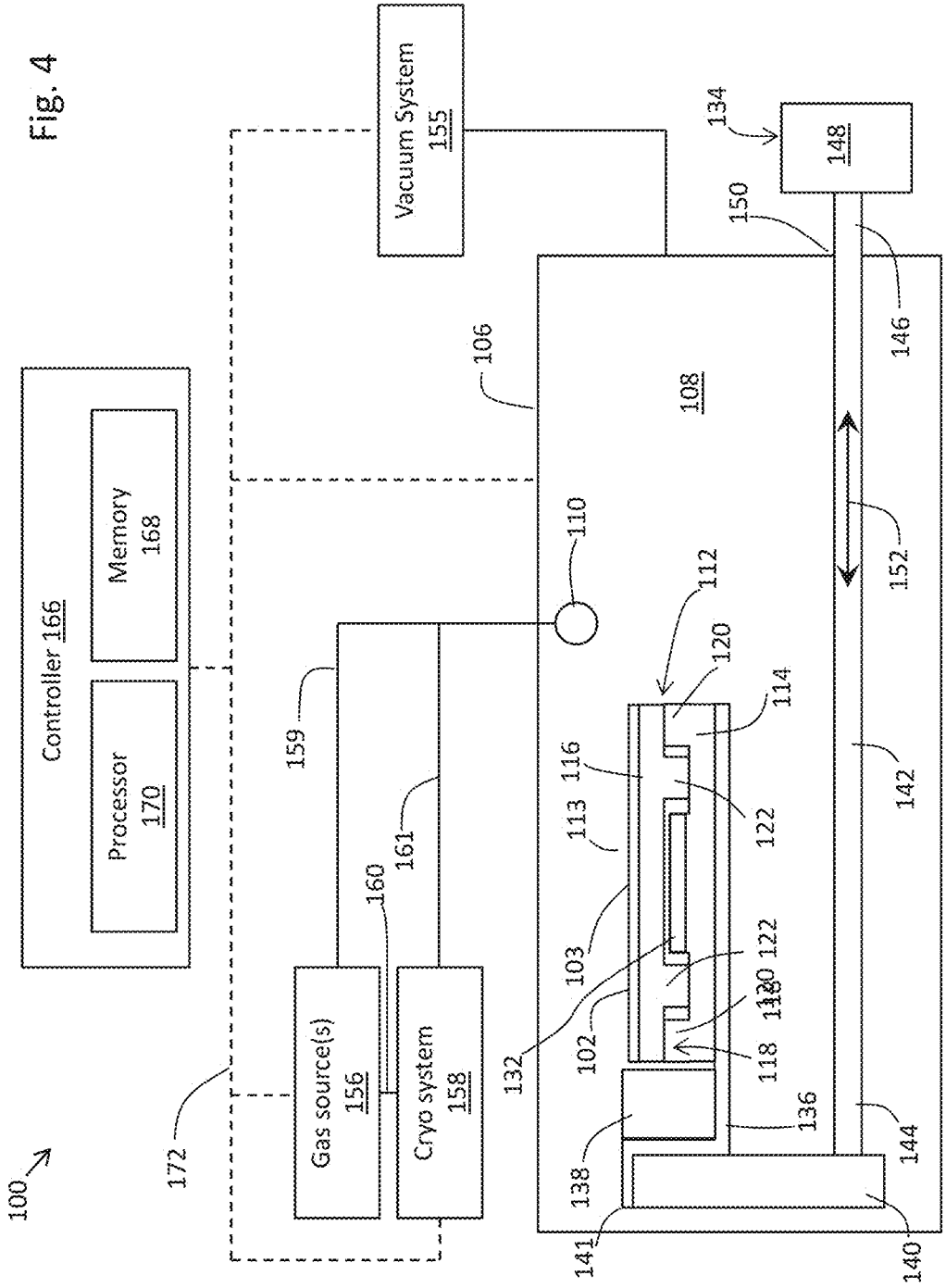

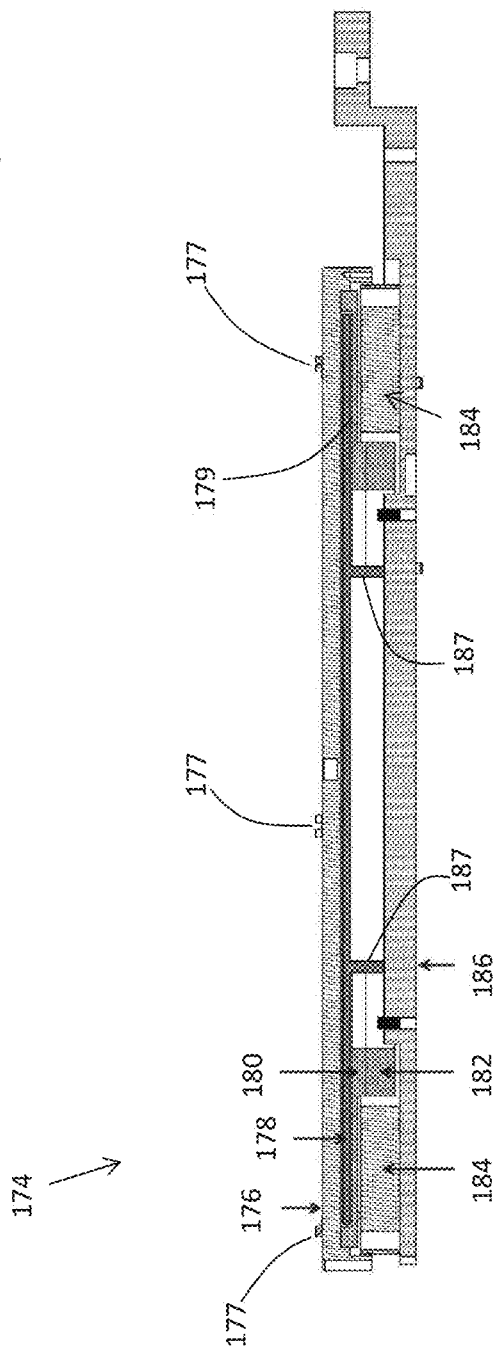

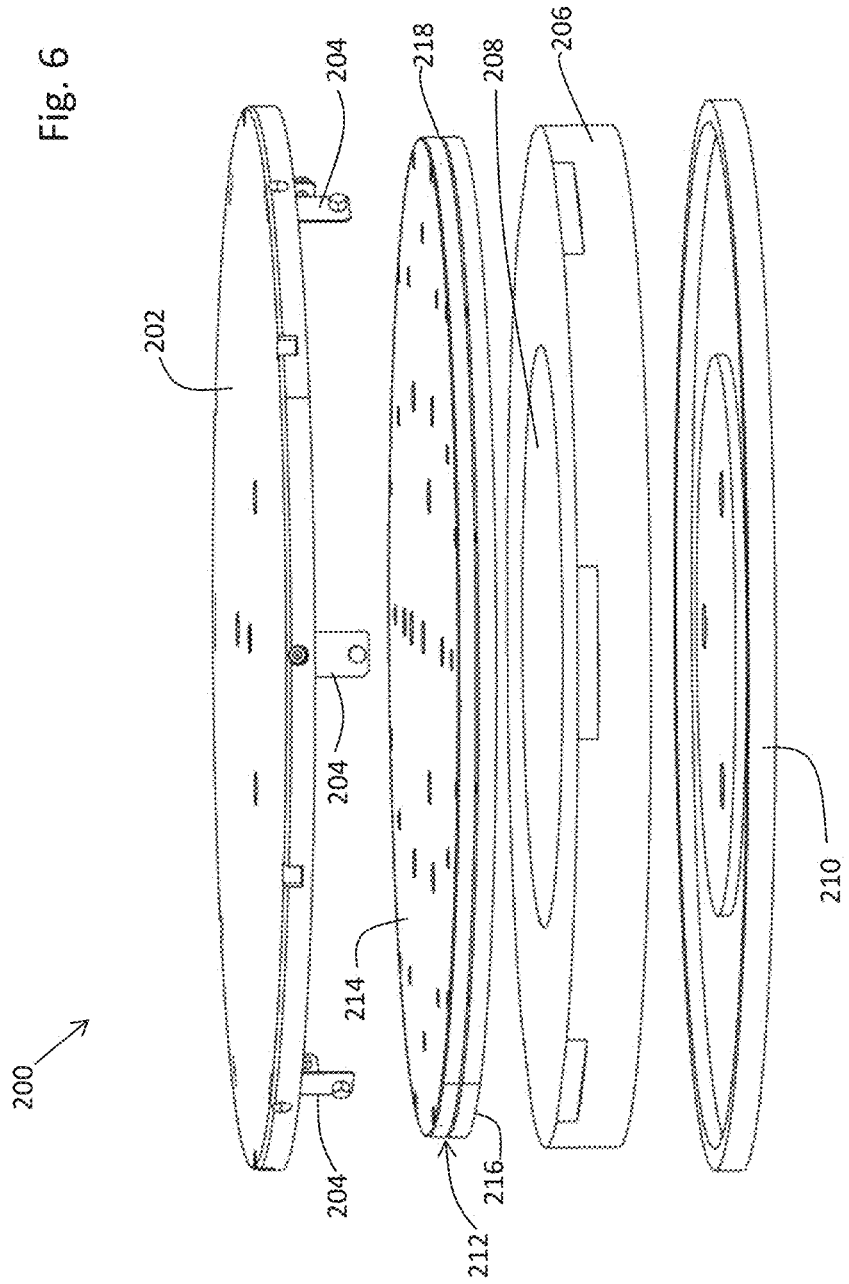

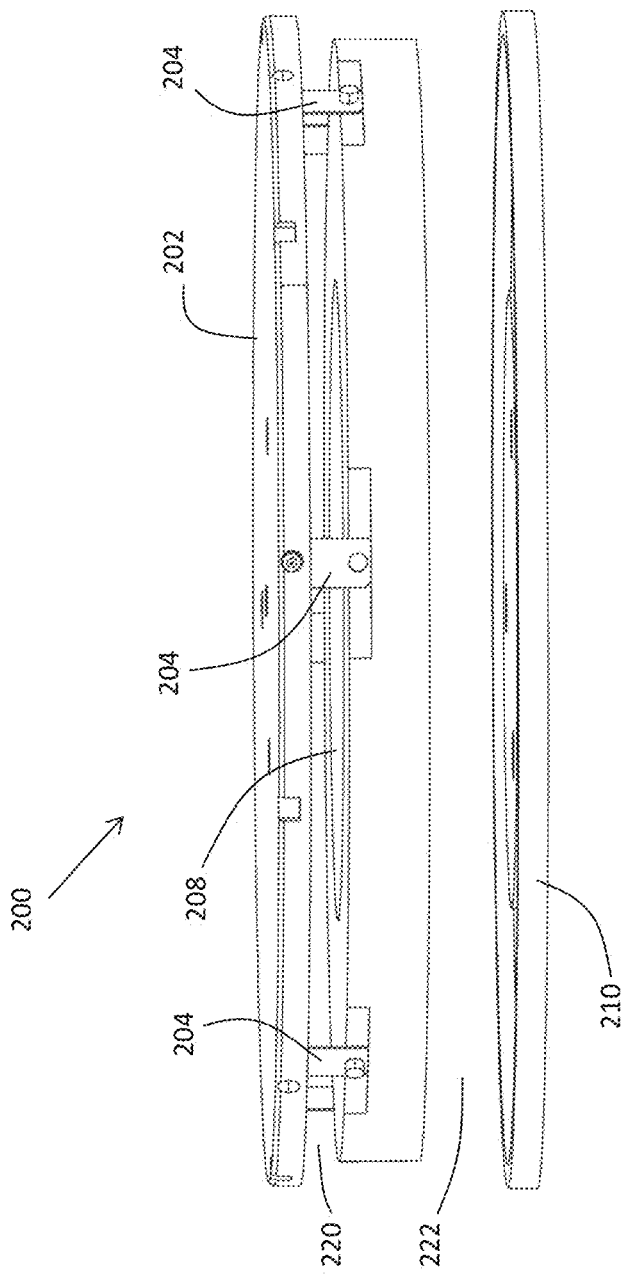

MAGNETICALLY LEVITATED AND ROTATED CHUCK FOR PROCESSING MICROELECTRONIC SUBSTRATES IN A PROCESS CHAMBER

PRIORITY AND RELATED APPLICATIONS

This application claims priority to U.S. Provisional Patent Application No. 62/419,662 filed Nov. 9, 2016, the contents of which are incorporated herein by reference in their entirety for all purposes.

FIELD OF USE

This disclosure relates to an apparatus and method for treating the surface of a substrate, and in particular for cleaning residue, debris, and other materials from a surface of a substrate.

BACKGROUND OF THE INVENTION

Advances in microelectronic technology cause integrated circuits (ICs) to be formed on substrates, such as semiconductor substrates, with ever increasing density of active components. The formation of ICs is carried out by sequential application, processing, and selective removal of various materials on the substrate. And, during formation, the exposed surface of the substrate requires cleaning steps to periodically remove process residue and debris. Various compositions have been developed for removal of specific classes of materials from substrates in semiconductor substrate processing, including both dry and wet cleaning technologies. Additionally, several different types of equipment are used to expose substrates to cleaning chemistries under a variety of conditions. An important aspect of this equipment is to achieve high throughput while cleaning the substrate in a uniform manner and minimize any debris or particles being generated by the equipment.

One cleaning strategy known in the microelectronic industry uses streams of particles to remove contaminants from workpiece surfaces. Cryogenic treatments of this type use one or more suitable nozzles to expand a pressurized and cooled fluid (which can be liquid and/or gas and may include some entrained solid material) into a low pressure process chamber. This causes the fluid to generate a treatment stream. The energy of this stream is used to dislodge and remove contaminants from surfaces. Various types of such cryogenic treatment streams are known as cryogenic aerosols, cryogenic aerosol jets, nano-aerosol particles, gas jet clusters, and the like. An excellent example of a cryogenic cleaning tool is available under the trade designation ANTARES® from TEL FSI, Inc., Chaska, Minn., USA.

In a typical cryogenic treatment, the treatment spray is dispensed from at least one nozzle into the processing chamber. A workpiece in the form of a microelectronic substrate is held on a rotatable and translatable chuck. The chuck is translated and/or rotated under the nozzle(s). The translation and/or rotation of the chuck, in effect, causes the nozzle to scan the substrate surface to treat all or a portion of the substrate surface as desired.

Motors, gears, and other mechanical elements have been used to translate and rotate the chucks that hold the workpieces. The friction between moving components and the lubricants and greases used to assist mechanical function have been a source of contamination on the workpieces. Cleaning treatments tend to be less effective when contamination is generated during the treatment.

Another issue with conventional treatments concerns the cycle time for carrying out a treatment. A typical treatment begins with a transition in which a suitable vacuum is established in the chamber to carry out the desired cryogenic treatment. During or after a treatment, the chamber may be vented up to increase the pressure, such as might occur when loading or unloading the substrates to and from the chamber. A vacuum or venting that occurs too quickly can cause lubricants and greases in mechanical assemblies to dislodge inside the chamber, resulting in potential contamination to the substrate. For example, contamination generated from these systems includes grease, particles and outgassed vapors, which have been problematic in achieving product performance targets. Vapors may condense and form contamination on the substrate. Vapors also may adsorb onto the substrate surface and form a contaminant film. To minimize this risk, an evacuation or venting have occurred more slowly to avoid risks of such contamination. It would be desirable for pressure changes to occur more quickly, in order to reduce cycle time and get more throughput.

Substrate cleaning equipment has been designed in several ways to achieve efficient and uniform cleaning results while minimizing particles and achieving high throughput. Hence, any improvements to cleaning efficiency (e.g., particle/defect reduction) or uniformity while also improving throughput would be desirable within the industry.

SUMMARY

Disclosed herein are cleaning systems and methods for semiconductor fabrication using rotatable and translatable chuck assemblies that incorporate magnetic levitation and rotation functionality for the chuck. The rotating chuck components do not physically contact other chuck components when levitated and rotating. This eliminates corresponding components whose friction or lubricants might generate contamination. The low friction chuck functionality of the present invention is useful in any fabrication tool in which a workpiece is supported on a rotating support during a treatment. The chuck is particularly useful in cryogenic cleaning treatments. By avoiding the use of lubricants for this rotating interface, process chambers can be evacuated and/or vented up much faster. This significantly reduces cycle time for cryogenic treatments.

Techniques herein include a magnetic drive system that levitates and rotates a substrate being processed. Based on this functionality, such drive mechanisms are referred to herein as maglev drive mechanisms. Such techniques can replace the motor, gears and bearings at the rotational interface, thereby reducing the associated contamination. Furthermore, such a magnetically levitated chuck is disposed within a vacuum-based semiconductor processing chamber that rotates and/or translates a substrate inside the chamber. Embodiments can include locating both the rotor(s), which are levitated, and the stator(s) (e.g., windings) inside the processing chamber into the chuck itself. Locating both principle parts of the rotation mechanism inside the chamber and in the chuck is beneficial for laterally translating the substrate holder (chuck) while maintaining precise tolerances between the stator and rotor components.

Additionally, techniques herein include stator/rotor pairing(s) with a surface area or footprint that is about the same or smaller than the footprint of a substrate being processed, or the same as or smaller than the footprint of a support component (e.g., spin plate) which secures the substrate during the process treatment. Such compact sizing benefits lateral translation as well as facilitating easier exhaust of particles and residue from the processing chamber. Another advantage is that this compact deployment also reduces the overall size of the chamber.

Techniques herein include a magnetically levitated substrate motion system for a sub-atmospheric semiconductor processing system in which both the stator and the rotor coexist in the same vacuum environment as the substrate. Both the rotor and stator mechanism may be designed using materials more suitable for a vacuum environment.

The magnetic levitation and rotation design of the present invention replaces a portion of the moving parts typically used to rotate a substrate. Previous embodiments of magnetically driven rotation have been practiced. However, many conventional embodiments of the magnetic stator windings are considered "dirty" and have not been placed into the process chamber to avoid exposure to vacuum to minimize particle or contamination issues. Such conventional magnetic levitation and rotation embodiments separated the rotor and magnetic stator by a vacuum wall to avoid this issue so that only the rotor would be inside the chamber. The result is that the magnetic stator diameter was larger than the associated chamber diameter or the substrate to create a much larger tool footprint.

Further, those conventional embodiments did not include both translating and rotating the chuck at the same time. Accordingly, those conventional embodiments were able to maintain a relationship between the stator and rotor because neither translated. For example, the stator would surround a portion of the process chamber to maintain uniform electromagnetic coupling with the rotor. In most instances, uniform control of the rotor was enabled by maintaining a relatively constant distance between the stator and rotor during the treatment. In contrast, it is not practical or economical to accurately control rotor levitation and rotation when the rotor translates relative to the stator.

The translation/rotation approaches disclosed herein are enabled by disposing the magnetic stator and rotor within the process chamber into the chuck itself. Also, the materials used in the magnetic stator assembly, including the windings, desirably are modified to be vacuum compatible (able to survive in a vacuum environment without undue damage or shortened life) and/or not release or generate contamination into the environment that can deposit onto the substrate. In addition to material selection, debris are minimized by placing the magnetic stator and rotor underneath the substrate chuck to prevent particles from reaching the front side of the substrate. Additionally, the chamber's vacuum conduit opening may be located below the plane of the substrate to increase the likelihood that levitation system generated contamination, if any, poses less risk to reach the front side of the substrate.

Another advantage provided by illustrative embodiments of the present invention relates to thermal management. Magnetic drives are in essence electric motors that generate heat during operation. The heat generated from magnetic needs to be dissipated, which is challenging in a vacuum environment of a process chamber since a vacuum is such a good thermal insulator. To solve this technical challenge, embodiments of the invention deploy thermally conductive materials into the chuck itself as well as into structures in the chamber that hold the chuck. These provide pathways to thermally conduct heat away from the magnetic drive. Under principles of the present invention, the magnetic drive is used to both levitate and rotate. Levitation is the tends to be the main source of heat that needs to be dissipated.

In one aspect, the present invention relates to an apparatus for treating a microelectronic substrate, comprising:

a) a housing configured to provide a processing chamber in which the microelectronic substrate is subjected to a treatment;
b) a rotatable chuck disposed within the processing chamber, wherein the rotatable chuck is configured to hold the microelectronic substrate during at least a portion of the treatment, wherein the chuck comprises a first chuck portion and a second chuck portion, wherein the second chuck portion levitates and rotates independently of the first chuck portion, and wherein the second chuck portion holds the microelectronic substrate during at least a portion of the treatment; and
c) a magnetic drive mechanism incorporated into the rotatable and translatable chuck in a manner effective to cause magnetic levitation and rotation of the second chuck portion relative to the first chuck portion.

In another aspect the present invention relates to an apparatus for treating a microelectronic substrate, comprising:

a) a process chamber in which the microelectronic substrate is positioned during a treatment;
b) a rotatable chuck disposed within the vacuum enclosure, wherein the rotatable and translatable chuck is configured to hold the microelectronic substrate during at least a portion of the treatment, wherein the chuck comprises a first chuck portion and a second chuck portion, wherein the second chuck portion levitates and rotates independently of the first chuck portion, and wherein the second chuck portion holds the microelectronic substrate during at least a portion of the treatment; and
c) a magnetic drive incorporated into the chuck and being capable of levitating and rotating the second chuck portion relative to the first chuck portion, wherein the levitation and rotation drive comprises at least one magnetic stator incorporated into the first chuck portion and at least one rotor incorporated into the second portion that is magnetically levitated and rotatably driven by the at least one stator.

In another aspect, the present invention relates to a method of treating a microelectronic substrate, comprising the steps of:

a) providing an apparatus comprising a process chamber;
b) holding a microelectronic substrate on a chuck, wherein the chuck comprises a first chuck portion and a second chuck portion, wherein the second chuck portion levitates and rotates independently of the first chuck portion, and wherein the second chuck portion holds the microelectronic substrate;
c) causing the second chuck portion on which the substrate is held to levitate and rotate during a substrate treatment.

In another aspect, the present invention relates to an apparatus for treating a microelectronic substrate, comprising:

a) a housing configured to provide a processing chamber in which the microelectronic substrate is subjected to a treatment, wherein the processing chamber is configured to provide a sub-atmospheric pressure environment during at least a portion of the treatment;
b) a fluid supply, said supply comprising a pressurized treatment fluid;
c) a translatable and rotatable chuck disposed within the processing chamber, wherein the translatable and rotatable chuck is configured to hold the microelectronic substrate during at least a portion of the treatment, wherein the chuck comprises a first chuck portion and a second chuck portion, wherein the second chuck portion levitates and rotates independently of the first chuck portion, and wherein the second chuck portion holds the microelectronic substrate during at least a portion of the treatment;

d) a nozzle coupled to the fluid supply and disposed in the process chamber and configured to use the treatment fluid to dispense a treatment onto the microelectronic substrate held on the chuck during at least a portion of the treatment;

e) a translation mechanism coupled to the first chuck portion in a manner effective to translate the chuck along a pathway within the process chamber to cause relative translational movement between the chuck and the nozzle; and g) a magnetic drive mechanism incorporated into the rotatable and translatable chuck in a manner effective to cause magnetic levitation and rotation of the second chuck portion relative to the first chuck portion.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 4 shows a third configuration of the apparatus of FIG. 1 in which the second chuck portion is supported on the first chuck portion such that the second chuck portion is magnetically levitated but is not rotating relative to the first chuck portion and has been translated to a position in the process chamber so that the nozzle is distal from the substrate as might occur before or after a treatment or when the substrate is loaded into or taken from the process chamber.

FIG. 5 shows a side cross-section view of one embodiment of a rotatable and translatable chuck that incorporates heater functionality as well as magnetic levitation and rotation capabilities according to principles of the invention.

FIG. 6 schematically shows an exploded perspective view of an alternative embodiment of a rotatable and translatable chuck with magnetic levitation and rotation capabilities according to principles of the invention as well as features that allow heater functionality to be incorporated into the chuck.

FIG. 7 is an assembled perspective view of the chuck of FIG. 6 with the maglev drive and heater removed.

DETAILED DESCRIPTION

Figure 1:
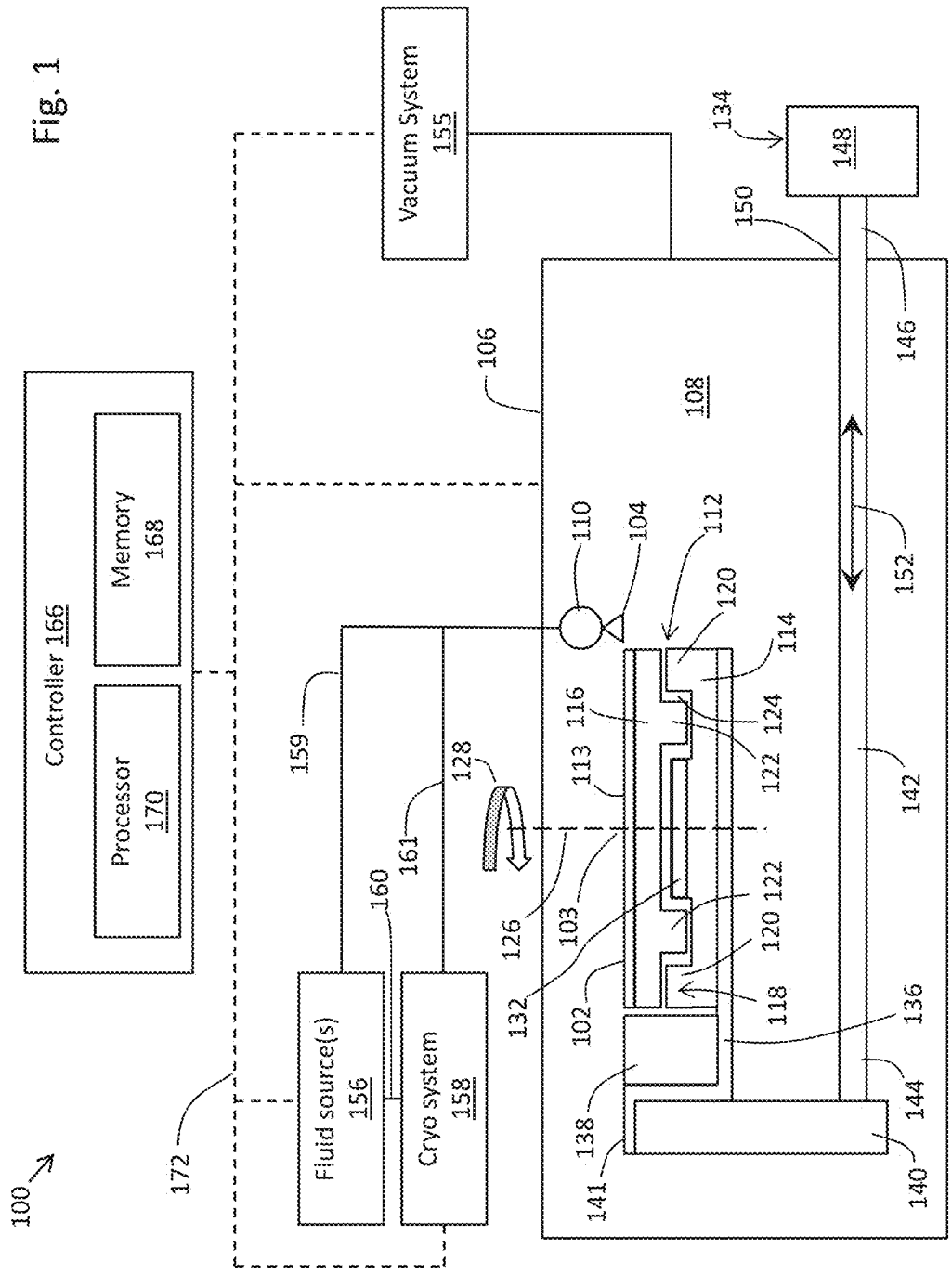
FIG. 1 includes a schematic illustration of an apparatus according to at least one embodiment of the disclosure in the form of a cleaning apparatus that uses a treatment spray to treat a microelectronic substrate, wherein a rotatable and translatable chuck is in a first configuration in which a second chuck portion is magnetically levitated and rotating relative to a first check portion about a rotation axis while the translation mechanism translates the chuck along a translation path, and wherein the chuck is positioned with the nozzle proximal to an edge of the substrate to begin a treatment (also suitable to end a treatment).

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

Techniques herein include deploying a magnetically levitating and rotating drive system inside a vacuum chamber such as where a highly contamination sensitive semiconductor substrate is being processed. This is accomplished by eliminating a vacuum wall between the stator and the rotor and instead incorporating at least one stator/rotor pair into a rotatable and translatable chuck inside the vacuum environment itself. In this way, the stator and rotor components translate together while the rotor and components attached to it can rotate, as desired, independently of the stator(s) and components attached to it. This is contrasted to conventional systems that position the stator outside the processing chamber with only the rotor being inside the chamber.

The principles of the present invention may be used in any microelectronic treatment or fabrication system in which a microelectronic substrate is supported on a rotating chuck during the course of one or more treatments. It is important for accurate chuck rotation that the relationship between a stator and corresponding rotor be accurately maintained. Advantageously, because the stator and rotor components both are incorporated into a chuck, close tolerances between a stator and corresponding rotor can be maintained not only when the chuck rotates about an axis but also when the chuck translates or traverses through the process chamber.

This makes rotatable and translatable chuck embodiments of the present invention particularly useful in cleaning tools such as the ANTARES® cryogenic cleaning tools commercially available from TEL FSI, Inc., Chaska, Minn. These tools implement cleaning treatments using translatable and rotatable chucks to scan substrate surfaces through a treatment stream. Magnetically levitated and rotated chucks of the present invention with magnetic levitation and rotation properties can be retrofit into existing ANTARES® or other tools or incorporated into new tools.

Cryogenic treatments generally involve the practice of generating treatments streams from fluid (gas and/or liquid) feed streams. The feed streams typically are pressurized and optionally cooled. When expanded through one or more suitable nozzles, the pressure release further cools the material. Such streams may be in the form of aerosol sprays, gas jet sprays, gas clusters, or the like. The cryogenic treatment stream dislodges contaminants on microelectronic substrate surfaces by imparting sufficient energy to overcome the adhesive forces between the contaminants and the microelectronic substrate. Hence, producing such treatment streams (e.g., aerosol sprays and/or gas cluster jet sprays in some embodiments) of the right energy may be desirable. The energy of the treatment spray, which correlates to cleaning power, is a function of mass and the velocity. The energy may be increased by increasing velocity or mass. Increasing energy may be important to overcome strong adhesive forces between contaminants and the surface of the substrate, including both larger contaminants and even when the contaminants are smaller (<100 nm).

To avoid unduly contaminating the substrate, materials desirably may be selected for the stator(s) (including the windings) and/or the rotor(s) that are not only vacuum compatible (able to survive in a vacuum environment with a suitable service life before maintenance or replacement), but also do not unduly release or generate contamination into the processing environment that could deposit onto the substrate surface. Such materials also may be selected to help conduct heat away from the windings and other stator components. Optionally, at least a portion of at least one stator 120 is coated with a protection layer effective to reduce outgassing from the magnetic stator 120 into the process chamber when the process chamber is configured to provide the sub-atmospheric pressure environment. In exemplary embodiments, the protection layer may comprise at least one of the following materials: at least one polycarbonate, at least one fluoropolymer, at least one polyimide, at least one polystyrene, PEEK (polyether ether ketone), at least one epoxy, or any combination thereof.

A fluoropolymer may comprise a fluoro-elastomer (including but not limited to those available under one or more of the designations FKM under ASTM D1418 or FPM under ISO/DIN 1629). Other fluoro-elastomers include FFKM (perfluoro elastomers), FEPM (tetrafluoro ethylene/propylene rubbers), or combinations of these. Other suitable fluoropolymers include PTFE (polytetrafluoroethylene), PFA (perfluoroalkoxy alkane), PVDF (polyvinylidene fluoride), PCTFE (polychlorotrifluoroethylene), and combinations of these.

Rotors also can be made from suitable materials that are compatible with vacuum processing. One example of such a material is a ferritic stainless steel. Ferritic stainless steels tend to be responsive to magnets in contrast to austenitic stainless steels which usually do not respond to magnets.

Incorporating stator and rotor components into the chuck itself provides a rotational drive mechanism that is compact and that has a small footprint. The compact size and footprint is useful in any systems with rotatable chucks even if translatable chuck capabilities are not needed. Thus, in addition to providing compact systems with rotatable and translatable chucks, the smaller footprint and size of the chuck also can decrease the footprint of a rotating but non-translating chuck. This may be desirable, for example, to reduce manufacturing costs or to reduce the size of the overall tool in which the chuck is used. Further, processing throughput is significantly increased for a facility if a larger amount of chambers are able to be used such as by more chambers being clustered together on a common platform. The additional chambers enable more substrates to be processed at the same time per square foot of facility space to enhance throughput. By avoiding lubricants or greases at the rotation interface, the use of a magnetic drive also reduces cycle time to lower or increase pressures.

An important advantage of the present invention is the ability to reduce cycle time in treatments that occur at non-ambient pressures. For example, before actually beginning a treatment, the pressure in the process chamber often is established before the treatment begins. In a cryogenic treatment, this typically means that a vacuum in the chamber is established. If the vacuum is established too quickly, greases and lubricants in conventional chuck rotation mechanisms may have a tendency to be dislodged into the rapidly established, low pressure environment. The resultant debris can settle and contaminate a microelectronic substrate in the chamber. To avoid this, vacuums may be established slowly. This may significantly increase cycle time when the time period to establish the vacuum is a significant portion of, comparable to, or even multiples of the actual treatment time itself. A key advantage of the chucks of the present invention is that chuck rotation is achieved by magnetic levitation and rotation. Lubricants and greases used in conventional gear-based systems are not needed. This allows pressure changes, e.g., evacuation to establish a vacuum or venting up to increase chamber pressure, to occur as rapidly as the vacuum equipment allows rather than being limited by a need to avoid lubricant or grease contamination. Venting up desirably occurs by introducing a gas such as nitrogen into the chamber 108.

Figure 2:
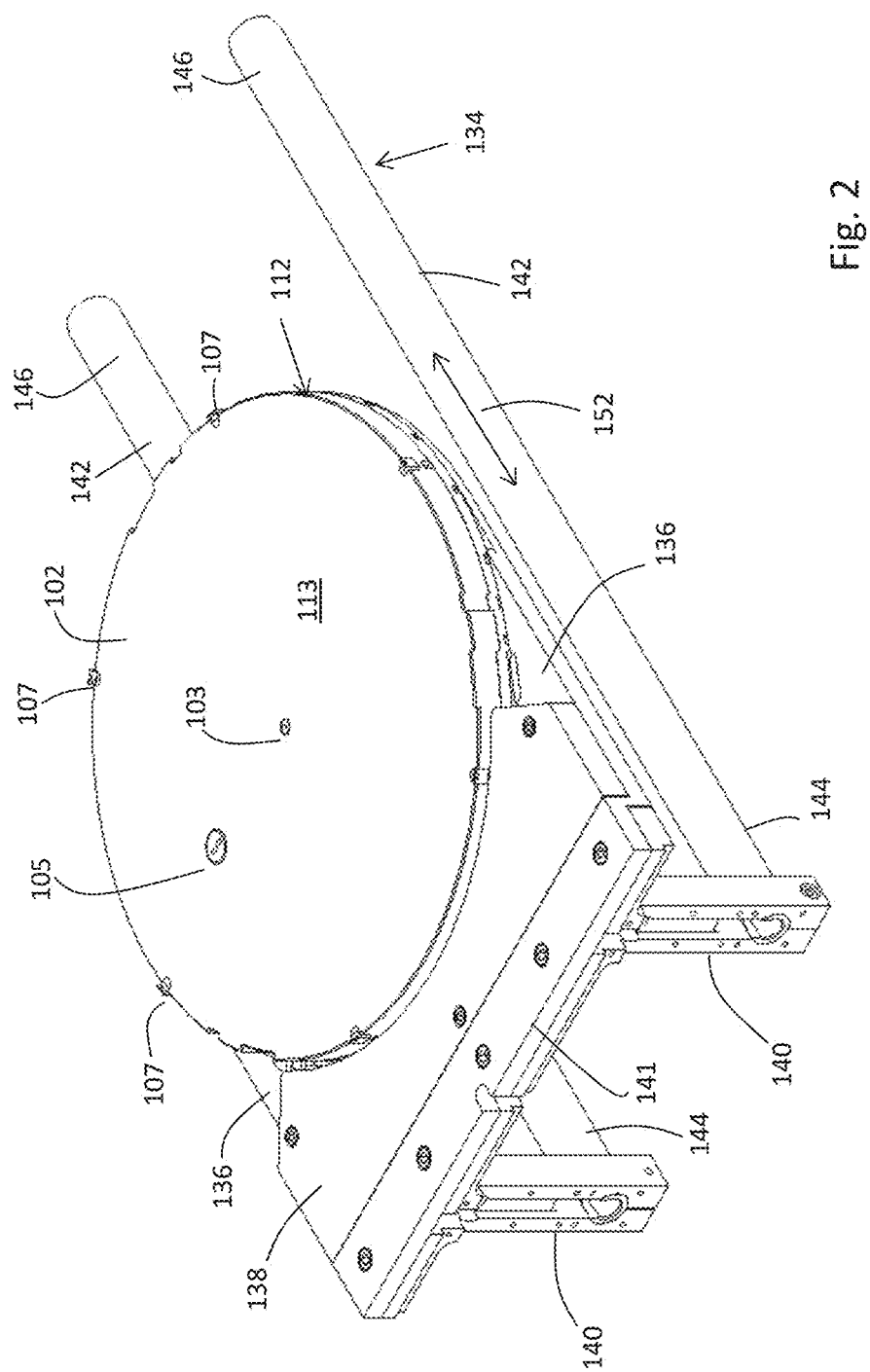
FIG. 2 includes a perspective view of a portion of the apparatus of FIG. 1 showing the rotatable and translatable chuck coupled to a portion of the translation mechanism.

Referring to FIGS. 1 and 2, the principles of the present invention will be illustrated by an apparatus in the form of cryogenic treatment system 100. System 100 may be used to treat microelectronic substrate 102 using a treatment spray 104. Such treatment spray 104 may be in the form of cryogenic aerosols, cryogenic aerosol jets, nano-aerosol sprays, gas jet clusters, and the like in some embodiments. However, the translation and/or rotation system disclosed herein is not intended to be limited to cryogenic treatment equipment, which is done for explanatory purposes only. The translation and/or rotation system may be incorporated into any other systems where a workpiece needs to be rotated during at least a portion of one or more treatments. The system 100 illustrates an exemplary implementation of the present invention within the cryogenic treatment context where temperature, pressure, gas flow rates, and many other process conditions are controlled to treat substrates as a demonstration of the many capabilities of the present invention to meet a variety of demanding performance criteria.

System 100 includes housing 106 that is configured to provide a process chamber 108. The pressure of process chamber is controllable to provide a sub-atmospheric pressure environment during at least a portion of a treatment. In representative modes of practice, the vacuum established in process chamber may be in a range from 1 milliTorr to 750 Torr. Often, the pressure is under 35 Torr or even under 10 Torr to enhance the formation of a treatment spray 104 comprising an aerosol and/or gas clusters.

For example, the cryogenic treatment spray may be formed by expanding relatively high pressure and low temperature gas and/or liquid into a sub-atmospheric environment of process chamber 104. In illustrative embodiments, the fluid may be supplied at pressures in the range from 10 psig to 900 psig, preferably 10 psig to 500 psig, more preferably 10 psig to 100 psig. The temperature of the fluid may be in the range from 50 K to 320 K, preferably 70 K to 320 K, more preferably 70 K to 150 K. So long as the fluid stream can flow and be dispensed into the chamber, some modes of practice may involve supplying fluids with entrained solid material. Preferably, the fluid is supplied at pressure and temperatures such that the fluid comprises a gas and/or a liquid.

Treatment spray 104 is dispensed into process chamber 108 through one or more suitable nozzles. For purposes of illustration, a single nozzle 110 is shown. Nozzle 110 receives fluid stream (e.g., a flow of one or more gases and/or one or more liquids) from a fluid supply system (described further below) comprising fluid supply source 156 coupled to nozzle 110 by feed line 159. Optionally, the fluid supply system may further incorporate a cooling system 158 to further cool the fluid(s) to a desired temperature prior to being expanded through nozzle 110 and dispensed into the process chamber 108. Fluid is supplied from fluid supply 156 to cooling system 158 by line 160. The cooled fluid is supplied from cooling system 158 to feed line 159 via line 161.

Fluid supply source 156 may comprise one or more pressurized and cooled fluids. Such fluids may be gases and/or liquids. Preferably, the pressurized and cooled fluids comprise at least one gas. Examples of suitable gases or liquids include one or more of nitrogen, argon, He, hydrogen, Xe, $CO_2$, neon, krypton, combinations of these, and the like. In one embodiment, the pressurized and cooled gas or liquid is argon. In another embodiment, the pressurized and cooled gas or liquid is nitrogen. In another embodiment, the pressurized and cooled gas or liquid comprises nitrogen and argon at a molar ratio of argon to nitrogen in the range from 1:100 to 100:1, preferably 1:20 to 20:1, more preferably 1:10 to 10:1.

In those embodiments comprising carbon dioxide, nitrogen and/or argon, the fluid may further comprise one or more additional gases or liquids as well. In one embodiment, the additional gas or liquids comprise helium, hydrogen, neon, or a combination of these wherein the molar ratio of the total amount of the additional gas(es) to the argon, carbon dioxide and/or nitrogen is in the range from 1:100 to 100:1, preferably 1:1 to 10:1. Specific mixtures include argon and helium; argon and hydrogen; argon, hydrogen, and helium; nitrogen and helium; nitrogen and hydrogen; nitrogen, hydrogen, and helium; carbon dioxide and helium; carbon dioxide and hydrogen; and carbon dioxide, hydrogen, and helium.

Nozzle 110 is configured to expand and cool the fluid stream as it is dispensed as spray 104 into the process chamber 108 onto substrate 102 below nozzle 110. As described further below, substrate 102 is scanned underneath nozzle 110 by translating and/or rotating substrate 102 to help ensure substrate 102 is uniformly treated. The nozzle 110 may be aimed at the upper surface of the chuck 112, and hence substrate 102, at any suitable angle. In one embodiment, the nozzle is disposed to dispense treatment spray 104 normal to the upper surface of chuck 112.

Nozzle 110 may be deployed at any suitable distance relative to the upper surface of substrate 102. In one embodiment, the distance between nozzle 110 and the upper surface of substrate 102 is in the range from 0.5 mm to 200 mm, preferably 0.5 mm to 100 mm, more preferably 0.5 mm to 60 mm, even more preferably 2 mm to 50 mm.

Substrate 102 is held on rotatable and translatable chuck 112 that is disposed in the process chamber 108. Substrate 102 thus is held by the movable chuck 112 while substrate 102 is translated and/or rotated during at least a portion of a treatment. Chuck may include gripping and/or supporting features 107 to help secure substrate 102 on chuck 112. The substrate 102 may be held chuck 112 using a wide variety of such gripping and/or supporting features such as any of the commonly practiced techniques within the field of semiconductor processing. These may include, but are not limited to, mechanical fasteners or clamps, vacuum clamping, gripping fingers, rest pads, electrostatic clamping, combinations of these, and the like. Further, the chuck 112 may include lift pins, actuation pins, pivot arms, et cetera, to help transfer the substrate 124 to and from the movable chuck 112 when the substrate 102 enters or is taken from the process chamber 108 manually or automatically via a wafer handling system (not shown).

Substrate 102 is shown as directly contacting upper surface 113 of chuck 112. In some modes of practice, substrate 102 may be supported so that a small gap (not shown) is provided between substrate 102 and upper surface 113.

The rotatable and translatable chuck 112 may be translated to traverse laterally along at least one translational degree of freedom 152 to facilitate translational scanning of the substrate 102 underneath the nozzle 110. Further, the translatable and rotatable chuck 112 is configured to rotate the substrate 102. Translation and rotation may be done concurrently or individually to adjust the dwell time of the spray 104 onto all or selected portions of the substrate 102 to adjust cleaning efficiency and throughput without undue risk of damaging features on the substrate 102.

At a high level, the chuck 112 incorporates a nested stator/rotor design for a small footprint and magnetic levitation and rotation to help avoid contamination sources (e.g., the chuck's internal components) and to enable translating and/or rotating the substrate 102 underneath the nozzle 110 during treatments. To this end, the nested stator/rotor design deploys the stator and rotor electromagnetic components, for levitating and rotating the substrate 102, underneath the rotating components of the chuck. In an exemplary embodiment, the nested stator/rotor design enables magnetic lifting, rotating, and centering the rotating components to enable spray treatment onto any desired portions or the entirety of the front-side surface area of the substrate 102 using a single nozzle 110.

The magnetically levitated and rotated chuck 112 is intended to provide frictionless or near-frictionless rotation of the substrate 102 using electromagnetic fields to levitate the mobile chuck portion and rotate it around a central rotation axis 126 (z-axis) at or near the center 103 of the chuck 112. The chuck 112 is designed to rotate the chuck components independently of or concurrently with translational movement as the chuck 112 underneath the nozzle 110 during the treatment.

Maintaining accurate relationships among stators 120 and rotor 122 is important to accurate rotation and achieving good treatment performance. One approach to enhance stator and rotor control and minimize particle problems is to co-locate the stators and rotor in the chuck 112 itself.

Chuck 112 includes a first chuck portion 114 that serves as a chuck base. First chuck portion 114 is coupled to translation mechanism 134 as described further below. Chuck 112 also includes second chuck portion 116. The second chuck portion 116 is rotatingly coupled to the first chuck portion 114 so that the second chuck portion 116 independently levitates and rotates relative to first chuck portion 114. Second chuck portion 116 holds substrate 102. Consequently, rotation of second chuck portion 116 imparts corresponding rotation to substrate 102.

Magnetic drive system 118 is incorporated into chuck 112 in a manner effective to magnetically levitate and rotate the second chuck portion 116 independently relative to first chuck portion 114. Magnetic drive system 118 causes second chuck portion 116, and hence substrate 102, to rotate around rotation axis 126. Magnetic drive system 118 can be actuated to cause rotation in either direction, e.g., either clockwise or counterclockwise rotation as desired.

Figure 3:
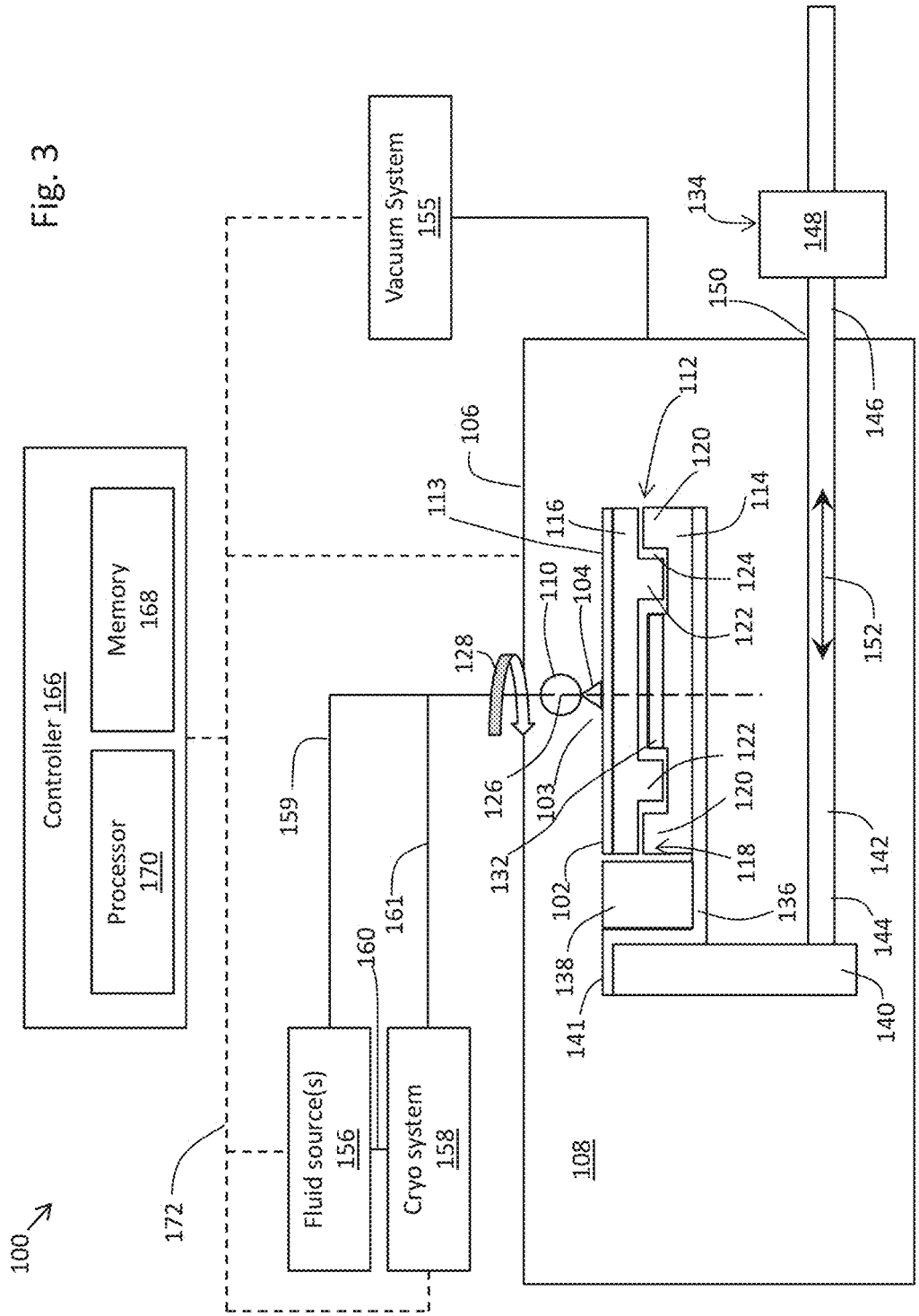
FIG. 3 shows a second configuration of the apparatus of FIG. 1, wherein translation of the chuck has occurred to cause relative movement between the chuck and the nozzle such that the nozzle has scanned across the substrate from the edge to the center of the substrate relative to FIG. 1.

Magnetic drive system 118 includes a stator system that is electromagnetically coupled to a rotor system in order to provide levitation and rotation functions. In the illustrative embodiment, these systems are shown as stators 120 and rotor 122. Stators 120 are magnetically coupled to rotor 122 in a manner effective to levitate and cause rotation of rotor 122. Being coupled to the remainder of second chuck portion 116 and substrate 102, this also imparts levitation and rotation to these components. FIGS. 1 to 3 show system 100 in a first configuration in which stator 120 is actuated to levitate and rotate second chuck portion. A gap 124 results between first chuck portion 114 and second chuck portion 116. Further, second chuck portion 116 holding substrate 102 rotates about rotation axis 126 via rotation degree of freedom 128. Preferably, rotation axis 126 is normal to the upper surface 113. Also in this first configuration, nozzle 110 is proximal to an edge of substrate. This corresponds to a configuration at the beginning of a treatment where nozzle 110 is beginning to scan substrate 102 as substrate 102 is caused to translate and rotate under nozzle 110. Alternatively, this also could correspond to a configuration at the end of a treatment stage in which nozzle 110 has completed a scan of substrate 102.

Substrate rotation is thereby enabled by the magnetic drive system 118 incorporated into the rotatable and translatable chuck 112. The result is that magnetic drive system 118 is translated along with the movable chuck 112 within process chamber 104 during translation actuation. This allows a precise relationship between stators 120 and rotor 122 to be maintained during both rotation and translation. Advantageously, the combination of the translation and rotation enables the nozzle 110 to pass over all or a portion of the substrate surface as desired.

In general, the stators 120 can be made of any electromagnetic component capable of generating magnetic fields that may be coupled to the rotor 122 to enable the lifting, rotating, and centering to occur. The stators 120 may include, but are not limited to, electromagnetic coils and/or magnets. In one illustrative embodiment, the stators 120 are electromagnetic coils (not shown) or windings (not shown) of conductive wire designed to generate magnetic fields when current flows through the coils. The current may be varied to vary the magnitude of the electromagnetic field of each stator to apply a controllable electromotive force to the rotor 122, to levitate and rotate it accurately about rotation axis 126.

In many instances, moving parts within the process chamber 108 are potential contaminant sources caused by mechanical friction or by lubricants used to reduce friction between the moving parts. Such contamination is even more problematic when a substrate is in close proximity to the moving parts or lubricants. In conventional practice, for example, the substrate could be secured to a mechanically rotated chuck, thereby placing the substrate in close proximity to potential contamination sources. Accordingly, any techniques or improvements to reduce friction sources or uses of lubricant within process chamber 108 would be desirable. Advantageously, the present invention significantly minimizes this contamination risk by eliminating many friction and lubrication sources associated with rotating functionality.

The present invention accomplishes this by magnetically levitating and rotating the second chuck portion 116, which optionally also may be practiced while the chuck 112 is being translated. When levitated, the second chuck portion 116 does not contact first chuck portion 114 to provide touch free rotation without mechanical coupling and without using lubricants to facilitate the rotation. The stator can magnetically lift and rotationally drive the rotor without the stator and rotor ever contacting during rotation as a treatment progresses. Even when second chuck portion 116 is not rotating, embodiments of system 100 maintain second chuck portion 116 in a levitated state relative to first chuck portion 114. Accordingly, the use of magnetic drive system 118 in chuck 112 eliminates major friction and lubrication from the rotation interface that could cause contamination in the treatment environment.

Additionally, this embodiment of magnetic drive system 118 is designed to incorporate the stators 120 and rotor 122 underneath the substrate 102, such that the stator and rotor are completely disposed underneath the substrate 102. The resultant footprint of chuck 112 remains compact so that the footprints of the chuck 112 and the substrate 102 are substantially the same. In some modes of practice, the overall footprint of chuck 112 may be slightly larger than the footprint of substrate 102. For example, the chuck footprint may be 0 to 15% larger than the substrate footprint. This matching of footprints helps to provide favorable flow dynamics of treatment materials over the surface of substrate 102. Undue projection or recessing of underlying chuck components can disturb process flows and can cause undesirable turbulence that could impact treatment performance.

The magnetic drive system 118 is configurable to rotate substrate 102 at different speeds and in different rotational directions with or without chuck translation to control the nozzle dwell time over all or selected portions of the substrate 102. This offers an ability to tune treatment performance and/or maximize particle removal efficiency. In some embodiments, the rotation and/or translation of the substrate 102 can be independently activated and deactivated by appropriate selection to optimize dwell time underneath the nozzle 110 to improve performance and/or particle removal efficiency, as needed. In one specific embodiment, the magnetic drive system 118 is enabled to rotate the substrate 102 at speeds up to 1000 RPM, preferably up to 500 rpm, more preferably up to 300 rpm.

As an additional component, first chuck portion 114 includes a temperature control component 132. The temperature control component is positioned on the first chuck portion 114 and provides temperature control, such as heating or cooling, to the substrate 102. Temperature control component 132 is coupled to first chuck portion 114 such that stators 120 cause rotor 122, and hence second chuck portion 116, to levitate and rotate independently of the heater 132. The temperature control component 132 may comprise heating/cooling elements, such as resistive heating elements or thermo-electric heaters/coolers within the movable chuck 112. Heating also important to prevent dislodge particles from re-depositing onto wafer (thermophoresis effects). The heating system may be used to improve temperature non-uniformity across the substrate 102 and minimize temperature-induced stress based on the temperature difference between the treatment spray 104 and process chamber conditions. For example, in the absence of heating, using a cold treatment fluid could cause the substrate to physically distort. Heating helps to maintain a uniform substrate temperature to avoid undue distortion. Heating also helps to prevent dislodged particles from re-depositing onto a cleaned substrate surface.

Preferably, temperature control component 132 is a heater. Heating may decrease the likelihood of condensation on the moveable chuck 112 or substrate 102 due to dramatic temperature changes during substrate treatments. In general, a heater may be capable of heating the substrate surface to temperatures ranging 25 C to 300 C, as desired. However, in one specific embodiment, the heating element temperature range is 25 C to 150 C, preferably 30 C to 120 C, more preferably 40 C to 110 C.

As another feature, second chuck portion 116 includes an access port 105 (shown in FIG. 2) on upper surface 113 to provide egress to underlying fasteners for assembly, maintenance, and service. Second chuck portion 116 can be rotated to bring successive fasteners into the field of view of access port 105.

Rotatable and translatable chuck 112 is attached to translation mechanism 134. Translation mechanism 134 is coupled to the chuck 112 in a manner effective to translate the chuck 112 along a pathway 152 within the process chamber 108 to cause relative translational movement between the chuck 112 and the nozzle 110. Actuation of translation mechanism 134 thus transports the moveable chuck 112 along a pathway 152 underneath the nozzle 110, to allow the microelectronic substrate 102 to be moved through the treatment spray 104 dispensed from the nozzle 110. In practical effect, translation of chuck 112 helps nozzle 110 scan across substrate 102 optionally as substrate 102 rotates. Translation can be distinguished from rotation in that translation of chuck 112 causes the rotation axis 126 of chuck 112 to move from one location in chamber 108 to another. In rotation, the relative position between rotation axis 126 and chuck 112 does not change even as chuck 112 translates within chamber 108.

Translation mechanism 134 includes a base member 136, support arms 140, shelf member 138, translation rods 142, and translation drive system 148. First chuck portion 114 is attached to base member 136. Consequently, translation of base member 136 causes corresponding translation of chuck 112. An end 141 of base member 136 is coupled to the tops of support arms 140 such that base member 136 cantilevers outward from support arms 140. The gap between end 141 and the chuck 112 is filled with shelf 138 to provide a smooth surface that is level with substrate 102. This promotes favorable flow of treatment materials from substrate 102 during a treatment. Base member 136 desirably is made from a thermally conductive material such as aluminum in order to help dissipate heat from the magnetic drive incorporated into chuck 112.

The base of each support arm 140 is connected to a corresponding translation rod 142 whose first ends 144 are connected to the support arms 140 and whose second ends 146 are coupled to a translation drive system 148. Portions of translation rods 142 include portions outside process chamber 108. Successive portions of rods 142 enter or leave the vacuum enclosure provided by chamber 108 as the rods are actuated to translate back and forth. Vacuum seal 150 provides an environmentally tight seal at the housing egress for rods 142 to help maintain the vacuum inside chamber 108 during this translation.

The translation drive system 148 may comprise any electrical, mechanical, electromechanical, hydraulic, or pneumatic device to allow actuation of rods 142. The translation drive system 148 may be designed to provide a range of motion sufficient to permit desired translation of the microelectronic substrate 102 to facility loading, unloading, and treatment operations. For example, during at treatment, substrate 102 is scanned at least partly through the area of treatment spray 104 emanating from the nozzle 110. During treatments, the substrate 102 can be translated underneath the nozzle 110 across a portion or the entire diameter of the substrate 102 at a suitable rate, such as up to 300 mm/sec, such that the nozzle 110 scans the desired portions of the substrate 102. In many embodiments, the treatment spray 104 is practiced to treat the entire surface of the substrate 102. In conjunction with the translational movement, the substrate 102 rotates to assist with full surface treatment.

Treatment materials dispensed into chamber 108 may be evacuated using vacuum system 156. Vacuum system 155 also may be used to establish and to maintain processing chamber 108 at an appropriate sub-atmospheric, process pressure. The vacuum system 114 may include one or more pumps to enable vacuum pressures to a desired level.

A control system 166 (which may include one or more integrated control devices) may be used to monitor, receive, and/or store process information. For example, control system 166 may include a memory 118 to store process recipes, command structures, user interfaces, real time process information, historical process information, feed supply, temperature control, pressure control, heating control, chuck levitation and rotation, chuck translation, substrate loading and unloading, substrate securement on the chuck 112, process control feedback, and the like. Controller may use a computer processor 120 to implement these operations and to receive and issue instructions and other signals over a network 122 that interfaces with the other components of system 100. Also have another separate device that just controls the levitation and rotation. We use two separate boxes.

For example, the control system 166 may control the electromagnetic fields energizing the stators 120 to account for changes in momentum or acceleration due to chuck 112 translating within the process chamber 108. The control system 166 may provide this control scheme using one or more current source(s) (not shown) connected to the stators 120 to control the electromagnetic fields in a suitable manner. The current sources may be connected to the stators 120 via electrical wire(s) (not shown) using a vacuum-sealed pass through to reach the stators 120 inside chamber 108. As another control example, the control system 166 may control the temperature control component 132 to adjust the temperature of the substrate 102 for purposes such as to minimize thermal distortion and/or prevent condensation on the substrate 102 or on the chuck 112.

It may be difficult from a practical perspective to directly monitor the temperature of the upper surface of the substrate 102 during treatments. In contrast, temperature sensors may be deployed to accurately measure and control the temperature of the temperature control component 132, as this temperature tends to accurately correlate to the substrate temperature.

FIG. 1 schematically illustrates a first configuration of system 100 in which second chuck portion is magnetically levitated and rotating relative to a first check portion about a rotation axis 126 while the translation mechanism 134 translates the chuck 112 along a translation path 152. In this first configuration, chuck 112 is positioned with the nozzle 110 proximal to an edge of the substrate 102 to begin a treatment. This position also is a suitable end a treatment after the nozzle 110 has finished scanning across the substrate 102 due to translation and rotation of substrate 102. In contrast to this first configuration, FIG. 3 shows a second configuration of the apparatus 100 wherein translation of chuck 112 further along pathway 152 has caused relative movement between the nozzle 110 and chuck 112 such that nozzle 110 now has scanned across substrate 110 from the edge to the center 103.

FIG. 4 shows a third configuration of apparatus 100 of FIG. 1 in which the second chuck portion 116 is supported on the first chuck portion 114 such that the second chuck portion 116 is levitated but is not rotating and such that chuck 112 has been translated to a position in the process chamber 108 so that the nozzle 110 is distal from the substrate 102 as might occur before or after a treatment or when the substrate 102 is loaded into or taken from the process chamber 108.

FIG. 5 shows a side cross-section view of one embodiment of a rotatable and translatable chuck 174 that incorporates heater functionality as well as magnetic levitation and rotation capabilities according to principles of the invention. Chuck 174 is in a standby configuration in which magnetic levitation is occurring, but rotation is not occurring. Chuck 174 includes a rotatable plate, or substrate holder 176 including substrate holding features 177. This component may be aluminum. Rotor 182 is coupled to holder 176 by an adaptor mechanism 180. Rotor 182 may be ring-shaped. Adaptor mechanism 180 may be aluminum. Adaptor mechanism 180 is configured to provide gap 179 when rotor 182 is coupled to holder 176. A non-rotating heater 178 fits into the gap 179. Heater 178 is connected to base member 186 by connections 187. Base member 186 also may be aluminum. Stators 184 are attached to base member 186 and are magnetically coupled to rotor 182. In operation, stators 184 magnetically levitate and rotate rotor 182, imparting corresponding levitation and rotation to holder 176. The base member 186, stators 184, heater 178, and heater connections 187 constitute a first chuck portion. The holder 176, adaptor mechanism 180, and rotor 182 constitute a second chuck portion that can be magnetically levitated and rotated independently from the first chuck portion.

FIGS. 6 and 7 schematically an alternative embodiment of a rotatable and translatable chuck 200 with magnetic levitation and rotation capabilities according to principles of the invention as well as features that would allow heater functionality to be incorporated into the chuck. Chuck 200 includes rotatable spin plate 202 that supports a microelectronic substrate (not shown).

Maglev drive 206 incorporates stator and rotor components that cooperate to provide magnetic levitation and rotation functionality. Tabs 204 are used to connect spin plate 202 to the rotor components of maglev drive 206. Tabs 204 help to synchronize the vertical and rotational movement of the rotor components and the spin plate 202.

Stator components are connected to chuck base 210. The stator components magnetically levitate and rotate the rotor components and therefore impart corresponding levitation and rotation to spin plate 202. Heater 212 is used to heat the substrate held on spin plate 202.

Heater 212 has a sandwich structure a resistive heating element 218 interposed between an upper plate 214 and a lower plate 216. The upper plate 214 and lower plate 216 may be made from aluminum for good thermal transfer. Heater 212 is connected to base 210 by suitable connecting members (not shown) through central aperture 208 of maglev drive 206. The resistive heating element 218 may be electrically connected to a controller via wires (not shown) running through a heater element standoff that interconnects base plate 210 and the lower heater plate 216.

When the components are assembled, heater 212 is positioned in heater gap 220. The tabs 204 are of an appropriate size to form this gap 220 while also providing a further offset space so that physical contact is avoided between the rotating and non-rotating components. Maglev drive 206 is positioned in gap 222. This positions the maglev drive 206 between base 210 and rotatable spin plate 202. Being coupled to base 210, rotor components and spin plate 202 levitate and rotate independently of heater 212. Base 210 desirably is made from a thermally conductive material such as aluminum in order to help dissipate heat from maglev drive 206.

Tabs 204 desirably incorporate resilient flexing characteristics. This helps to accommodate different thermal expansion between spin plate 202 and rotor components.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" or "substrate" as used herein generically refers to an object or workpiece being processed in a treatment apparatus such as an apparatus in accordance with the invention, wherein such object or workpiece is intended to constitute all or a portion of a microelectronic device. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

In the aforementioned description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

The invention claimed is:

1. An apparatus for treating a microelectronic substrate, comprising:
    a) a housing configured to provide a processing chamber in which the microelectronic substrate is subjected to a treatment;
    b) a rotatable chuck disposed within the processing chamber, wherein the rotatable chuck is configured to hold the microelectronic substrate during at least a portion of the treatment, wherein the chuck comprises a first chuck portion and a second chuck portion rotatingly coupled to the first portion, wherein the second chuck portion magnetically levitates and magnetically rotates independently of the first chuck portion, and wherein the second chuck portion holds the microelectronic substrate during at least a portion of the treatment; and
    c) a magnetic drive mechanism incorporated into the rotatable chuck in a manner effective to cause magnetic levitation and magnetic rotation of the second chuck portion relative to the first chuck portion, wherein the magnetic drive mechanism comprises a rotor system and a stator system co-located and nested in the rotatable chuck underneath the second chuck portion, wherein the rotor system is attached to the second chuck portion between the second chuck portion and the first chuck portion, wherein the stator system is attached to the first chuck portion between the first chuck portion and the second chuck portion, and wherein the stator system is magnetically coupled to the rotor system.

2. The apparatus of claim 1, further comprising a translation mechanism coupled to the chuck in a manner effective to translate the chuck along a pathway within the process chamber.

3. The apparatus of claim 2, wherein the translation mechanism comprises at least one translatable rod coupled to the chuck to cause chuck translation along a translation path and wherein successive portions of the translation rod are disposed within the process chamber during at least a portion of the treatment as the translation rod translates to cause chuck translation.

4. The apparatus of claim 2, wherein the translation mechanism comprises a thermally conductive base member coupled to the first chuck portion in a manner effective to dissipate heat from the magnetic drive mechanism.

5. The apparatus of claim 1, further comprising a fluid supply system and at least one nozzle coupled to the fluid supply system, wherein the nozzle is disposed to dispense a treatment fluid from the fluid supply system onto the microelectronic substrate supported on the chuck.

6. The apparatus of claim 5, wherein the nozzle is disposed to dispense a treatment fluid normal to a surface of the chuck.

7. The apparatus of claim 1, wherein the fluid supply system comprises at least one pressurized fluid.

8. The apparatus of claim 7, wherein the at least one pressurized fluid is pressurized and cooled.

9. The apparatus of claim 8, wherein the at least one pressurized fluid is cooled to a temperature in the range from 70 K to 150 K.

10. The apparatus of claim 2, wherein the translation mechanism and the magnetic drive mechanism are configured to concurrently rotate and translate the chuck.

11. The apparatus of claim 5, wherein the fluid supply comprises a pressurized gas.

12. The apparatus of claim 5, wherein the fluid supply comprises a pressurized liquid.

13. The apparatus of claim 5, wherein the fluid supply comprises a pressurized and cooled gas and a pressurized and cooled liquid.

14. The apparatus of claim 1, wherein each of the microelectronic substrate secured to the chuck and the rotatable chuck has a footprint, and wherein the footprint of the microelectronic substrate and the footprint of the chuck are substantially the same.

15. The apparatus of claim 1, wherein each of the microelectronic substrate and the rotatable chuck has a footprint, and wherein the footprint of the chuck is 0 to 15% larger in area than the footprint of the microelectronic substrate.

16. The apparatus of claim 1, further comprising a heater incorporated into the first chuck portion that is thermally coupled to the second chuck portion in a manner effective to heat the substrate held on the second chuck portion, and wherein the second chuck portion levitates and rotates independently of the heater.

17. An apparatus for treating a microelectronic substrate, comprising:
    a) a housing configured to provide a processing chamber in which the microelectronic substrate is subjected to a treatment, wherein the processing chamber is configured to provide a sub-atmospheric pressure environment during at least a portion of the treatment;
    b) a fluid supply, said supply comprising a pressurized treatment fluid;
    c) a translatable and rotatable chuck disposed within the processing chamber, wherein the chuck comprises a first chuck portion and a second chuck portion, wherein the second chuck portion magnetically levitates and magnetically rotates independently of the first chuck portion, and wherein the second chuck portion holds the microelectronic substrate during at least a portion of the treatment;
    d) a nozzle coupled to the fluid supply and disposed in the process chamber and configured to use the treatment fluid to dispense a treatment onto the microelectronic substrate held on the rotatable and translatable chuck during at least a portion of the treatment;
    e) a translation mechanism coupled to the first chuck portion in a manner effective to translate the rotatable and translatable chuck along a pathway within the process chamber to cause relative translational movement between the chuck and the nozzle; and g) a magnetic drive mechanism incorporated into the rotatable and translatable chuck in a manner effective to cause magnetic levitation and magnetic rotation of the second chuck portion relative to the first chuck portion, wherein the magnetic drive comprises at least one magnetic stator incorporated into the first chuck portion underneath the second chuck portion and between the first chuck portion and the second chuck portion and at least one rotor incorporated into the second portion underneath the second chuck portion and between the second chuck portion and the first chuck portion such that the at least one rotor and the second chuck portion are magnetically levitated and rotatably driven by the at least one stator.

* * * * *